(12) United States Patent
Lu et al.

(10) Patent No.: US 6,251,779 B1
(45) Date of Patent: Jun. 26, 2001

(54) METHOD OF FORMING A SELF-ALIGNED SILICIDE ON A SEMICONDUCTOR WAFER

(75) Inventors: Hsiao-Ling Lu, Chungho; Li-Yeat Chen; Wen-Yi Hsieh, both of Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/584,694

(22) Filed: Jun. 1, 2000

(51) Int. Cl.[7] ............................................. H01L 21/44
(52) U.S. Cl. ..................... 438/682; 438/299; 438/308; 438/655; 438/686
(58) Field of Search ................................. 438/299, 308, 438/683, 686, 682, 655

(56) References Cited

U.S. PATENT DOCUMENTS

| | | | |
|---|---|---|---|
| 5,877,085 | * | 3/1999 | Matsubara ........................ 438/649 |
| 5,940,699 | * | 8/1999 | Sumi et al. ....................... 438/233 |
| 6,096,628 | * | 8/2000 | Greenlaw et al. ................ 438/530 |
| 6,159,856 | * | 12/2000 | Nagano ............................. 438/683 |

FOREIGN PATENT DOCUMENTS

| | | | |
|---|---|---|---|
| 651077 A1 | * | 5/1995 | (EP) . |
| 800204 A2 | * | 10/1997 | (EP) . |
| 936664 A2 | * | 8/1999 | (EP) . |

* cited by examiner

*Primary Examiner*—Trung Dang
(74) *Attorney, Agent, or Firm*—Winston Hsu

(57) ABSTRACT

This invention provides a method of forming a self-aligned silicide of a semiconductor wafer, the surface of the semiconductor wafer comprising at least one silicon device. A cobalt-containing metallic layer is formed on the semiconductor wafer which covers on the surface of the silicon device. A first thermal treatment process is performed to rapidly heat the semiconductor wafer up to 300~500° C. for 10~50 seconds and form $Co_2Si$ on the surface of the silicon device. A second thermal treatment process is performed to rapidly heat the semiconductor wafer up to 400~680° C. for 20~50 seconds and then cool down the semiconductor wafer afterwards so as to convert $Co_2Si$ into CoSi. An etching process is performed to remove the metallic layer. A third thermal treatment process is performed to rapidly heat the semiconductor wafer up to 700~950° C. for 30~60 seconds and then cool down the semiconductor wafer afterward so as to convert CoSi into the self-aligned silicide.

8 Claims, 4 Drawing Sheets

METHOD OF FORMING A SELF-ALIGNED SILICIDE ON A SEMICONDUCTOR WAFER

BACKGROUND OF THE INVENTION

1. Field of the Invention

The present invention relates to a method of forming a self-aligned silicide, abbreviated as salicide, on a semiconductor wafer, and more particularly, to a method of forming a cobalt-containing salicide on a semiconductor wafer.

2. Description of the Prior Art

Self-aligned silicide, (salicide) is applied widely in the formation of a MOS transistor to reduce the sheet resistance, and hence provide the devices of the MOS transistor and the metal good ohmic contacts. In the prior art method of forming the salicide, the rapid thermal process is applied in the thermal silicidation process. However, rapid thermal technology is still developing at present time, limiting the yield of the salicide process. Therefor, how to improve the rapid thermal process to enhance the yield of the salicide process becomes a very important issue in the formation of the MOS transistor.

Please refer to FIG. 1 and FIG. 2. FIG. 1 is a schematic diagram of a cobalt-containing salicide 20 on a MOS transistor 10 according to the prior art. FIG. 2 illustrates the relation between time and temperature for the first rapid thermal process in the prior art method of forming a salicide. The MOS transistor 10 is positioned on the surface of a semiconductor wafer 22 and isolated from other devices by shallow trenches 24 formed by using the shallow trench isolation method. The MOS transistor 10 comprises a poly-silicon gate 12, a gate insulation layer 13, two spacers 14, a source 16 and a drain 18. Cobalt-containing salicides 20 are formed on the surface of the poly-silicon gate 12, the source 16 and the drain 18.

In the prior art method of forming the cobalt-containing salicide 20, a cobalt-containing metallic layer 26 is deposited on the MOS transistor 10, and then a first rapid thermal process is performed to rapidly heat the semiconductor wafer 22 up to 400~680° C. The high temperature is maintained for 10~40 seconds and then cooled down. This first rapid thermal process allows a portion of metals in the cobalt-containing metallic layer 26 react with poly-silicon of the gate 12 and silicon of the source 16 and the drain 18, resulting in the formation of CoSi or $Co_2Si$.

As shown in FIG. 2, during the first rapid thermal process, the temperature is rapidly increased up to T1 in a period for t1 seconds (about 10 seconds), wherein T1 is between 400~680° C. Then the high temperature is maintained at T1 during the period of (t2–t1) (for about 10~40 seconds) and cooled down at about the $20^{th}$~$50^{th}$ second of the first rapid thermal process.

After performing the first rapid thermal process, a wet etching process is performed to remove the unreacted or remaining cobalt on the MOS transistor 10. Then a second rapid thermal process is performed to convert CoSi or $Co_2Si$ into $CoSi_2$ with low resistance so as to form the cobalt-containing salicide 20 in the interface between silicon and poly-silicon. Because of the low resistance of $CoSi_2$ the resistance between cobalt and silicon, or cobalt and poly-silicon can be reduced.

In the prior art method of forming the salicide, the temperature of the first rapid thermal process allows cobalt and silicon to react and form a complex-phase structure which comprises not only CoSi or $Co_2Si$ but also $CoSi_2$ co-exiting with CoSi. As a result, CoSi or $Co_2Si$ cannot be completely converted into $CoSi_2$ with low resistance in the second rapid thermal process, increasing the resistance of the cobalt-containing salicide. Besides, using a transmission electron microscope to observe the cobalt-containing salicide formed by the prior art method, there was a defect found in it. Therefore, the yield of the salicide process may be reduced.

SUMMARY OF THE INVENTION

It is therefore a primary objective of the present invention to provide a method of forming a self-aligned silicide containing cobalt on a semiconductor wafer to solve the above mentioned problems.

In a preferred embodiment, the present invention provides a method of forming a self-aligned silicide (salicide) on a semiconductor wafer, the surface of the semiconductor comprising at least one silicon device, the method comprising:

forming a cobalt-containing metallic layer on the semiconductor wafer which covers on the surface of the silicon device;

performing a first thermal treatment process to rapidly heat the semiconductor wafer up to 300~500° C. for 10~50 seconds and form a first silicide on the surface of the silicon device;

performing a second thermal treatment process to rapidly heat the semiconductor wafer up to 400~680° C. for 20~50 seconds and then cool down the semiconductor wafer afterwards so as to convert the first silicide into a second silicide;

performing an etching process to remove the metallic layer positioned on the surface of the semiconductor wafer; and performing a third thermal treatment process to rapidly heat the semiconductor wafer up to 700~950° C. for 30~60 seconds and then cool down the semiconductor wafer afterward so as to convert the second silicide into the self-aligned silicide.

It is an advantage of the present invention that the method can reduce the resistance of the salicide and provide the MOS transistor and the metal a good ohmic contact, and hence enhance the yield of the salicide process.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERED EMBODIMENT

Figure 1:
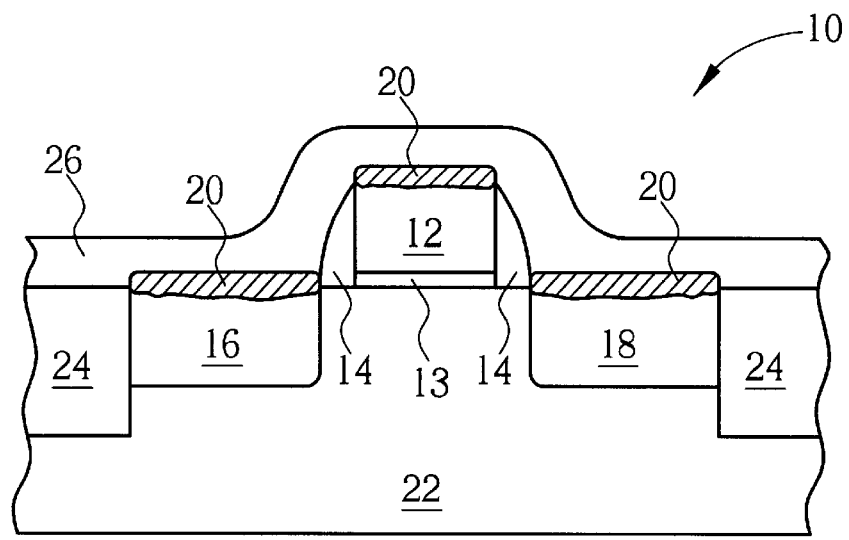
FIG. 1 is a schematic diagram of the cobalt-containing salicide of the MOS transistor according to the prior art.
Figure 2:
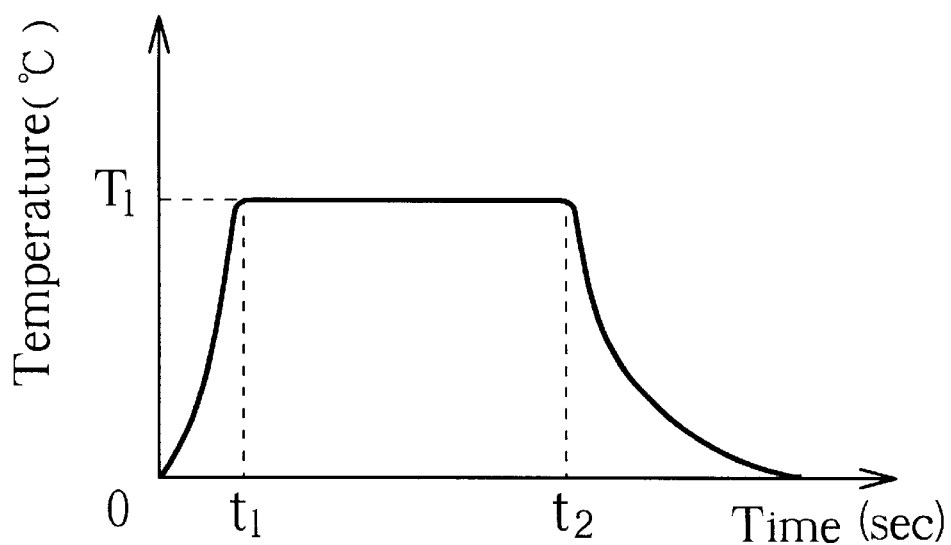
FIG. 2 illustrates the relation between time and temperature in the first rapid thermal process in the prior art method of forming the salicide.

Please refer to FIG. 3 to FIG. 6. FIG. 3 to FIG. 6 are schematic diagrams of the cobalt-containing salicide of the MOS transistor according to the present invention. The method of forming a salicide on a semiconductor wafer in the present invention is used to form a cobalt-containing salicide of a MOS transistor 30. The MOS transistor 30 is positioned on the surface of the semiconductor wafer 44 and isolated from other devices by shallow trenches 46. The MOS transistor 30 comprises a poly-silicon gate 32, a gate insulation layer 34, two spacers 36, a source 38 and a drain 40.

Figure 3:
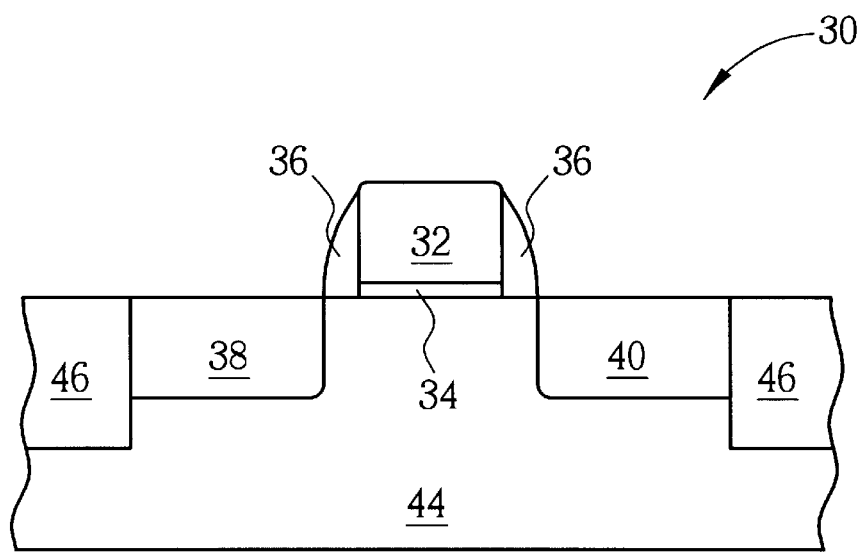
FIG. 3 is a schematic diagram of the cobalt-containing salicide of the MOS transistor according to the present invention.

The method is performed on the semiconductor wafer 44 which has been defined by the poly-silicon gate 32 and processed by ion implantation. The surface of the semiconductor wafer 44 comprises three silicon devices: the source 38, the drain 40 and the poly-silicon gate 32 of the MOS transistor, as shown in FIG. 3. After soft etching, a cobalt-containing metallic layer 48 is formed on the surface of the semiconductor wafer 44 by sputtering. The metallic layer 48 covers on the surfaces of the source 38, the drain 40 and the poly-silicon gate 32. The metallic layer 48 is made by cobalt or cobalt alloy, and its thickness is about 50~300 angstrom.

Figure 4:
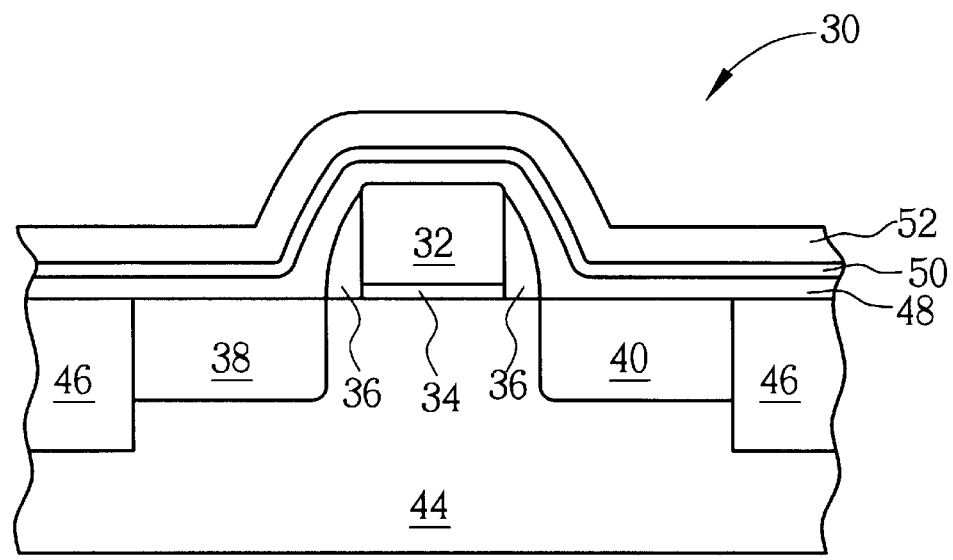
FIG. 4 to FIG. 6 are schematic diagrams of the formation of the cobalt-containing salicide on the semiconductor wafer according to the present invention.
Figure 5:
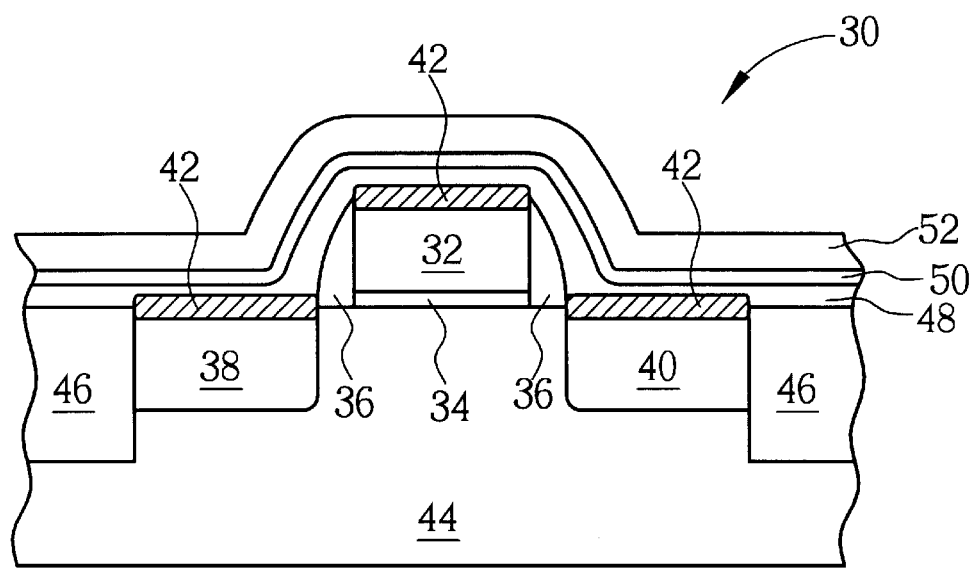
Figure 6:
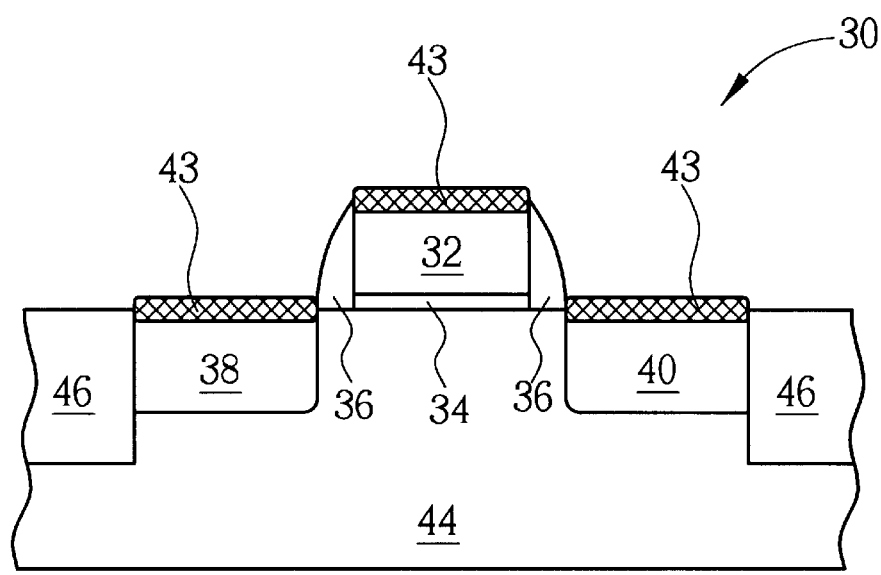

Then using the same sputtering machine, a titanium (Ti) layer 50 and a titanium nitride (TiN) layer 52 are formed on the surface of the metallic layer 48, as shown in FIG. 4. The thickness of the titanium layer 50 and the titanium nitride layer 52 are about 10~200 angstrom and 50~500 angstrom, respectively. The titanium layer 50 and the titanium nitride layer 52 are used as a cap layer for covering the metallic layer 48.

Figure 7:
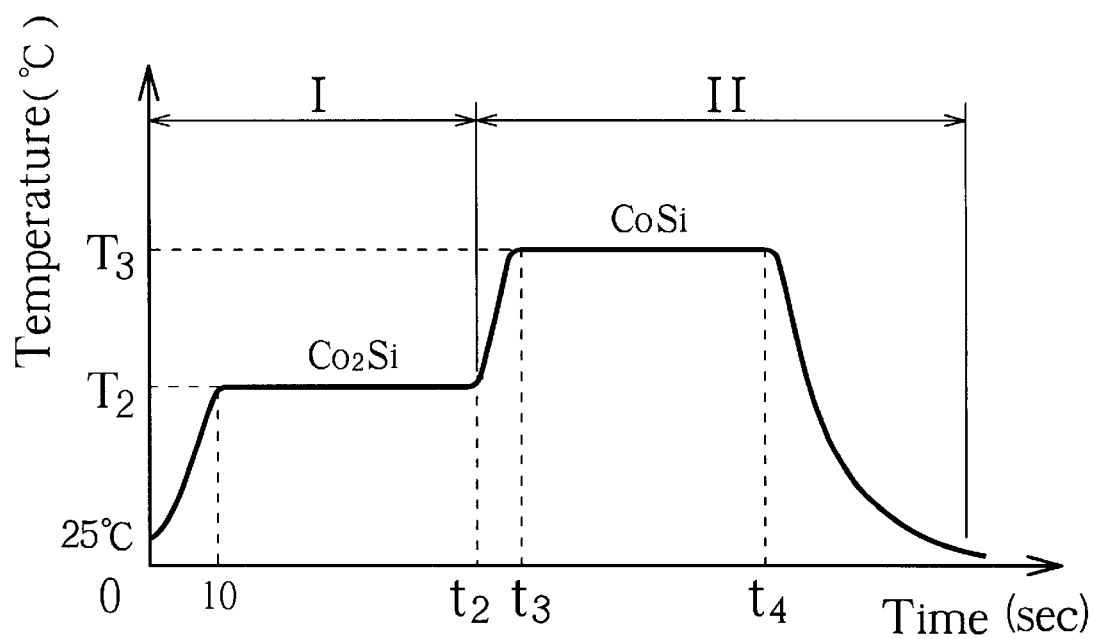
FIG. 7 illustrates the relation between time and temperature in the first and second rapid thermal annealing processes according to the present invention.

Please refer to FIG. 7. FIG. 7 illustrates the relation between time and temperature of the first and second thermal treatment processes in the formation of the salicide according to the present invention. After sputtering the cobalt-containing metallic layer 48 and its cap layer, a first thermal treatment process is performed to rapidly heat the semiconductor wafer 44 up to 300~500° C. for 10~50 seconds and form a first silicide on the surfaces 42 of the source 38, the drain 40 and the poly-silicon gate 32.

Then a second thermal treatment process is performed to rapidly heat the semiconductor wafer 44 up to 400~680° C. for 20~50 seconds and then cool down the semiconductor wafer 44 afterwards so as to convert the first silicide on the surfaces 42 of the source 38, the drain 40 and the poly-silicon gate 32 into a second silicide.

In FIG. 7, the first and the second thermal treatment processes are marked as I and II, respectively. T2 and T3 are the heating temperatures for the first and the second thermal treatment processes, repectively. T2 is between 300~500° C., and T3 is between 400~680° C. Time t2, t3 and t4 are at about the $20^{th}$~$60^{th}$ second, $30^{th}$~$70^{th}$ second and $40^{th}$~$110^{th}$ second after the beginning of the first thermal treatment process, respectively.

Next, a wet etching process is performed to remove the titanium nitride layer 52, the titanium layer 50 and the metallic layer 48 for removing the cap layer and unreacted cobalt. At last, a third thermal treatment process is performed as a rapid thermal annealing process to rapidly heat the semiconductor wafer 44 up to 700~950° C. for 30~60 seconds and then cool down the semiconductor wafer 44 afterward so as to convert the second silicile into the salicide 43 which is formed of $CoSi_2$ with low resistance.

In the present invention, the first thermal treatment process and the second thermal treatment process are performed as a rapid thermal annealing process in one machine. The heating temperature in the first thermal treatment process is low in which cobalt can be converted into the first silicide formed of $Co_2Si$, and the heating temperature in the second thermal treatment process is high in in which $Co_2Si$ can be converted into the second silicide formed of CoSi. The third thermal treatment process is to convert CoSi into the salicide formed of $CoSi_2$ with low resistance.

The method of forming the salicide 43 according to the present invention is characterized in performing two thermal treatment processes to form the second silicide formed of CoSi. The first and the second thermal treatment processes are performed as two continuous rapid thermal annealing processes in one machine, so the temperature and time can be precisely controlled to form $Co_2Si$ or CoSi, preventing cobalt and silicon devices from forming the complex-phase to affect the $CoSi_2$ production. In consequence, after the third thermal treatment process, cobalt and the silicon devices can react and produce merely the salicide 43 made of $CoSi_2$ with low resistance. Therefore, the sheet resistance between cobalt and the silicon devices can be reduced and a good ohimc contact can be formed to enhance the yield of the salicide process.

In contrast to the prior art method of forming the salicide 20, the method of forming the salicide 43 according to the present invention comprises three thermal treatment processes. The first and the second thermal treatment processes are two rapid thermal annealing processes performed in one machine to heat the semiconductor wafer up to 300~500° C. and 400~680° C., respectively, so as to convert cobalt into $Co_2Si$ and then into CoSi. The third thermal treatment process is to rapidly heat the semiconductor wafer up to 700~950° C. to convert CoSi into $CoSi_2$ with low resistance. The two continuous rapid thermal annealing processes can enhance the yield of the salicide process, and reduce the sheet resistance between cobalt and silicon devices to provide a good ohmic contact between the MOS transistor and the metal.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a self-aligned silicide (salicide) on a semiconductor wafer, the surface of the semiconductor comprising at least one silicon device, the method comprising:

forming a cobalt-containing metallic layer on the semiconductor wafer which covers on the surface of the silicon device;

performing a first thermal treatment process to rapidly heat the semiconductor wafer up to 300~500° C. for 10~50 seconds and form a first silicide on the surface of the silicon device;

performing a second thermal treatment process to rapidly heat the semiconductor wafer up to 400~680° C. for 20~50 seconds and then cool down the semiconductor wafer afterwards so as to convert the first silicide into a second silicide;

performing an etching process to remove the metallic layer positioned on the surface of the semiconductor wafer; and performing a third thermal treatment process to rapidly heat the semiconductor wafer up to 700~950° C. for 30~60 seconds and then cool down the semiconductor wafer afterward so as to convert the second silicide into the self-aligned silicide.

2. The method of claim 1 wherein the first silicide is formed of $Co_2Si$.

3. The method of claim 1 wherein the second silicide is formed of CoSi.

4. The method of claim 1 wherein the self-aligned silicide is formed of $CoSi_2$.

5. The method of claim 1 wherein the metallic layer is formed of cobalt (Co) or Co alloy with about 50~300 angstrom (Å) in thickness.

6. The method of claim 5 wherein the surface of the metallic layer further comprises a titanium (Ti) metallic layer with about 10~200 angstrom (Å) in thickness and a titanium nitride (TiN) metallic layer with 50~500 angstrom (Å) in thickness and used as a cap layer for covering the cobalt-containing metallic layer.

7. The method of claim 1 wherein the silicon device can be a polysilicon gate, a drain or a source of a MOS transistor.

8. The method of claim 1 wherein the first thermal treatment process and the second thermal treatment process are performed as a rapid thermal annealing process in one machine, and the third thermal treatment process is also performed as a rapid thermal annealing process.

* * * * *